(12) United States Patent
Shin et al.

(10) Patent No.: US 6,372,151 B1
(45) Date of Patent: Apr. 16, 2002

(54) STORAGE POLY PROCESS WITHOUT CARBON CONTAMINATION

(75) Inventors: Taeho Shin, San Jose; Nam-Hun Kim, Cupertino; Jeffrey D. Chinn, Foster City, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/362,929

(22) Filed: Jul. 27, 1999

(51) Int. Cl.$^7$ .................. B44C 1/22; H01L 21/306; C23F 1/00

(52) U.S. Cl. .............. 216/67; 216/64; 216/79; 438/710; 438/719

(58) Field of Search .............. 216/67, 64, 79; 438/710, 719; 252/79.3

(56) References Cited

U.S. PATENT DOCUMENTS

| | | | |
|---|---|---|---|
| 4,330,384 A | * 5/1982 | Okudaira et al. | 204/192.37 |
| 4,352,724 A | 10/1982 | Sugishima et al. | 204/192 E |
| 4,431,477 A | * 2/1984 | Zajac | 438/719 |
| 4,502,915 A | 3/1985 | Carter et al. | 438/734 |
| 4,595,484 A | 6/1986 | Giammarco et al. | 204/298 |
| 4,615,764 A | 10/1986 | Bobbio et al. | 156/643 |
| 5,047,115 A | * 9/1991 | Charlet et al. | 216/64 |
| 5,095,346 A | 3/1992 | Bae et al. | 357/23.6 |
| 5,180,464 A | * 1/1993 | Tatsumi et al. | 216/58 |
| 5,399,518 A | 3/1995 | Sim et al. | 437/52 |
| 5,401,356 A | 3/1995 | Enami et al. | 156/643 |
| 5,569,356 A | 10/1996 | Lenz et al. | 156/643.1 |
| 5,693,182 A | 12/1997 | Mathuni | 156/645.1 |
| 5,712,813 A | 1/1998 | Zhang | 365/149 |
| 5,721,090 A | 2/1998 | Okamoto et al. | 430/313 |
| 5,733,808 A | 3/1998 | Tseng | 438/239 |
| 5,811,022 A | 9/1998 | Savas et al. | 216/68 |
| 5,866,483 A | 2/1999 | Shiau et al. | 438/720 |
| 5,874,363 A | 2/1999 | Hoh et al. | 438/721 |
| 5,876,497 A | 3/1999 | Atoji | 117/85 |
| 5,877,090 A | 3/1999 | Padmapani et al. | 438/714 |
| 5,882,961 A | 3/1999 | Klingbeil, Jr. et al. | 438/180 |
| 5,885,402 A | 3/1999 | Esquibel | 156/345 |
| 6,127,278 A | * 10/2000 | Wang et al. | 438/719 |
| 6,235,214 B1 | 5/2001 | Chin et al. | 216/17 |

OTHER PUBLICATIONS

U.S. application No. 09/206,201, Chin et al., filed Dec. 3, 1998.
U.S. application No. 09/263,634, Khan et al., filed Mar. 5, 1999.

* cited by examiner

Primary Examiner—Randy Gulakowski
Assistant Examiner—Shamim Ahmed
(74) Attorney, Agent, or Firm—Townsend Townsend & Crew; Joseph Bach

(57) ABSTRACT

The method of present invention etches a layer of polysilicon formed on a substrate disposed within a substrate processing chamber. The method flows an etchant gas including sulfur hexafluoride, an oxygen source and a nitrogen source into the processing chamber and ignites a plasma from the etchant gas to etch the polysilicon formed over the substrate. In a preferred embodiment, the etchant gas consists essentially of $SF_6$, molecular oxygen ($O_2$) and molecular nitrogen ($N_2$). In a more preferred embodiment the etchant gas includes a volume ratio of molecular oxygen to the sulfur hexafluoride of between 0.5:1 and 1:1 inclusive and a volume ratio of the sulfur hexafluoride to molecular nitrogen of between 1:1 and 4:1 inclusive. In an even more preferred embodiment, the volume ratio of $O_2$ to sulfur hexafluoride is between 0.5:1 and 1:1 inclusive and the volume ratio of sulfur hexafluoride to $N_2$ is between 1.5:1 and 2:1 inclusive.

21 Claims, 3 Drawing Sheets

STORAGE POLY PROCESS WITHOUT CARBON CONTAMINATION

BACKGROUND OF THE INVENTION

The present invention relates to a process and apparatus for etching silicon. More specifically, the present invention relates to etching polysilicon to form structures, such as storage nodes, that are used in the fabrication of integrated circuits.

Dynamic Random Access Memory (DRAM) devices include arrays of memory cells. Each memory cell includes a single access transistor and a storage capacitor. As device sizes shrink and more and more transistors are squeezed into a fixed area of an integrated circuit, DRAM capacity has increased. It has been suggested, however, that the capacitance of the storage capacitor must have a minimum level in order to send a sufficiently strong signal to the sense circuitry and provide sufficient immunity to soft errors. For example, it has been suggested that the storage capacitor of a one Gigabit DRAM should have a capacitance of between 25–40 femto Farads (fF) in order to provide reliable operation. This minimum capacitance believed to be required for DRAM devices has not been reduced in proportion to the size reduction of the access transistors. Thus, the size of the storage capacitor is an important factor in the overall capacity of a DRAM device. In order to continue to increase the density of DRAM devices, semiconductor manufacturers have been required to develop methods to increase the storage capacity of a memory cell capacitor per unit area.

There are two main approaches to increasing the storage capacity of such capacitors. The first is to increase the dielectric constant of the insulating material. The second is to increase the storage area of the capacitor electrodes. A combination of both approaches has been used over the years as DRAM capacity has increased from the thousand-bit level (K-bit) to the million-bit level (M-bit) and now to the billion-bit level (G-bit).

One approach that has been used to increase the storage area of the capacitor electrodes has been to form what are known as stacked capacitors or stacked planar capacitors, as opposed to planar capacitors that were used in early DRAM devices. Stacked capacitors involve building a primarily vertical, as opposed to horizontal capacitor structure, in order to reduce the amount of chip real estate required by the capacitor. Stacked planar capacitors are, as their name implies, capacitors that achieve their capacitance requirements using both vertical and horizontal structures.

There are a number of different types of stacked or stacked planar capacitors that involve various three dimensional shapes. Some of these different capacitors, as referred to by those of skill in the industry, include box capacitors, fin-shaped capacitors, hammer capacitors, crown capacitors and cylindrical capacitors among others. At least some of these structures can be formed by depositing a relatively thick polysilicon layer and etching the layer to form vertical protrusions. These protrusions have been on the order of 5–6,000 Å deep in currently available DRAM devices such as 64 M-bit devices, and can be on the order of 8–10,000 Å or deeper in the next generation of DRAM devices.

FIG. 1 shows an example of such polysilicon protrusions. In FIG. 1 a polysilicon layer 15 is deposited over a silicon substrate 10. Polysilicon layer 15 has been etched using a photoresist mask 20 to define protrusions 15a, 15b. In the exemplary device shown in FIG. 1, protrusions 15a, 15b have a height of approximately 10,000 Å and are separated by approximately 0.3 $\mu$m. A trench 25 is formed between protrusions 15a, 15b. Trench 25 has a depth equal to the height of the protrusions and a width equal to the distance between the protrusions. The ratio of the trench depth to the trench width is referred to as the aspect ratio of the trench.

One known process that has been used to etch polysilicon to form protrusions such as 15a, 15b shown in FIG. 1 forms a plasma from sulfur hexafluoride ($SF_6$), hydrogen bromide (HBr) and molecular oxygen ($O_2$). This etch process has been sufficient to form the protrusions included in some stacked capacitors but the process has limited commercial applicability to future devices because of its etch selectivity (generally less than 2:1) and etch rate (generally less than 4–5,000 Å/min).

Another method to form protrusions 15a, 15b forms a plasma from $SF_6$, a fluorocarbon, such as $CHF_3$, and $O_2$. This process can provide sufficient etch selectivity (greater than 3:1) and a sufficient deposition rate (greater than 10,000 Å/min) to meet the requirements of many different DRAM manufacturers. Some manufacturers, however, desire alternative methods to form protrusions 15a, 15b to meet other criteria. For example, one prominent DRAM manufacturer requires that the polysilicon etchant chemistry provide an etch selectivity to photoresist of at least 3:1, an etch rate of at least 10,000 Å/min and not include carbon in the etchant gas.

SUMMARY OF THE INVENTION

The present invention provides a new method for etching silicon, and in particular polysilicon, that provides improved etch rate and photoresist etch selectivity as compared to an $SF_6$/HBr/$O_2$ etch process and does not include a fluorocarbon etchant gas or any other carbon-containing gas. The method of the present invention provides polysilicon etch rates of close to or greater than 15,000 Å/min and a photoresist-to-polysilicon etch selectivity of 3:1 and higher. The method of the present invention also provides for either vertical or slightly tapered etch profiles. These and other characteristics of the method of the present invention make it ideal for forming storage nodes and other structures that are used in the fabrication of 1 GB DRAMs and in the fabrication of projected future DRAMs.

The method of present invention etches a layer of polysilicon formed on a substrate disposed within a substrate processing chamber. The method flows an etchant gas including sulfur hexafluoride, oxygen and nitrogen into the processing chamber and ignites a plasma from the etchant gas to etch the polysilicon formed over the substrate.

In one embodiment the etchant gas includes sulfur hexafluoride ($SF_6$), molecular oxygen ($O_2$) and molecular nitrogen ($N_2$). The volume ratio of molecular oxygen to the sulfur hexafluoride is between 0.5:1 and 1:1 inclusive and the volume ratio of the sulfur hexafluoride to molecular nitrogen is between 1:1 and 4:1 inclusive. In a preferred embodiment, the etchant gas consists essentially of $SF_6$, $O_2$ and $N_2$. In an even more preferred embodiment, the volume ratio of $O_2$ to sulfur hexafluoride is between 0.8:1 and 1:1 inclusive and the volume ratio of sulfur hexafluoride to $N_2$ is between 1.5:1 and 2:1 inclusive.

In another embodiment the etchant gas includes sulfur hexafluoride, nitrous oxide ($N_2O$) and molecular oxygen. The volume ratio of $SF_6$ to nitrous oxide is between 1:1 and 4:1 inclusive and the volume ratio of $O_2$ to $SF_6$ is between 0.25:1 and 0.5:1 inclusive. In an even more preferred version of this embodiment, the volume ratio of $SF_6$ to $N_2O$ is between 1.5:1 and 2:1 inclusive and the ratio of $O_2$ to $SF_6$ is between 0.4:1 and 0.5:1 inclusive.

These and other embodiments of the present invention, as well as its advantages and features, are described in more detail in conjunction with the text below and attached figures.

DESCRIPTION OF THE SPECIFIC EMBODIMENTS

I. Introduction

The present invention provides a new process for etching polysilicon. The disclosed process has an etch selectivity to photoresist of greater than 3.0:1, an etch rate of greater than 10,000 Å/min and provides for either vertical or slightly tapered etch profiles. The method of the present invention can be used to reliably and repeatedly etch trenches in polysilicon layers greater than 10,000 Å deep and separated by 0.3 microns or less. Furthermore, the invention can be practiced in etch chambers of conventional design and utilizes readily available chemical sources.

II. Exemplary Chamber

Figure 2A:
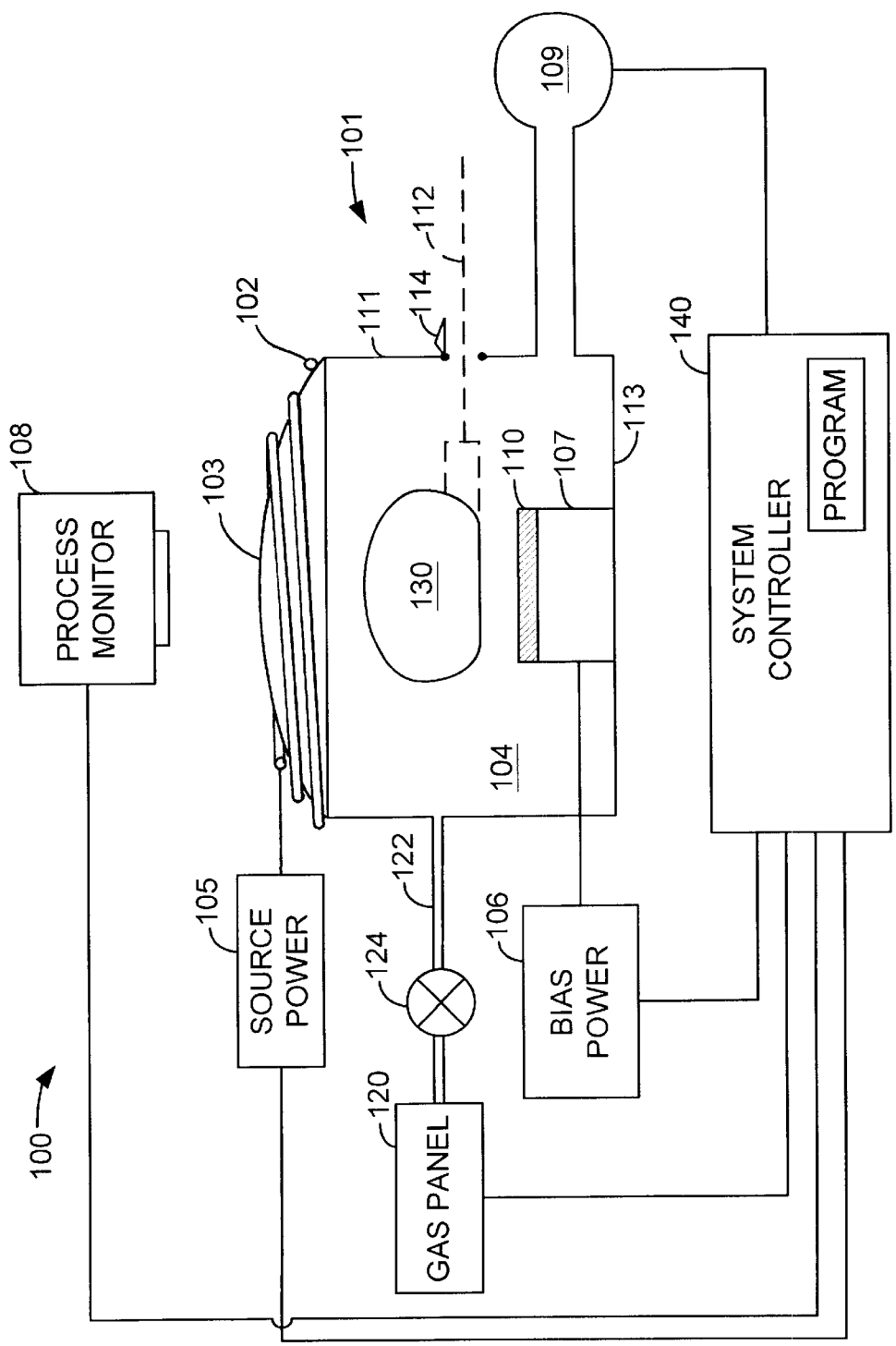
FIG. 2A shows a partial cross sectional schematic of an exemplary semiconductor wafer processing system in which the method of the present invention may be implemented.

FIG. 2A depicts a schematic diagram of a semiconductor wafer processing system 100 which the method of the present invention can be practiced. The depicted system is illustratively an inductively coupled plasma etch system. The invention, however, is applicable to other HDP or inductively coupled plasma (ICP) semiconductor wafer processing system as well as to other types of plasma etching systems.

System 100 comprises a process chamber 101, a source power supply 105, a bias power supply 106 and a controller 140. Process chamber 101 comprises a process volume 104 defined by a dome 103, a cylindrical sidewall 1 11, and a bottom 113. Dome 103 is typically made of a dielectric material such as quartz. Sidewall 111 and bottom 113 are typically made of a metal such as aluminum or stainless steel. Source power supply 105 couples an RF signal (e.g., 12.56 MHz) to an antenna 102. Antenna 102 has a plurality of turns located proximate the top 103 and produces RF electromagnetic fields that excite a process gas (or gases) located in volume 104 to form and/or sustain a plasma 130.

A robot arm 112, shown in phantom, transfers the wafers 110 in and out of process chamber 101 through a slit valve 114. During substrate processing, a semiconductor wafer 110, which may contain partially formed integrated circuit structures, is supported upon a pedestal (electrostatic chuck) 107. Wafer 110 is exposed to the plasma to facilitate processing. Ions and electrons from the plasma 130 bombard the wafer 110. Since the electrons are more mobile than the ion, more electrons than ions strike the wafer. As a result wafer 110 acquires a negative bias. The negative bias accelerates positive ions from the plasma towards wafer 110. Pedestal 107 and thus the wafer is biased by an RF signal (e.g., 13.56 MHz) supplied to pedestal 107 by bias power supply 106. The density of ions in plasma 130 is primarily controlled by the signal applied to antenna 102, while the energy of the ions is primarily controlled by the signal applied to pedestal 207.

Temperature within chamber 101 is partly controlled by circulating a fluid (e.g., water-based ethylene glycol) through separate heat exchange passages (not shown) within sidewall 111 and dome 103 of the chamber. Temperature of the substrate being etched is controlled by a combination of a gas applied to the backside of the substrate through passages (not shown) within pedestal 107 and by circulating a fluid through a heat exchange passage (not shown) within the pedestal.

A process monitor 108 monitors conditions within process chamber 101. The process monitor can be any sensor, or combination of sensors, for measuring a condition that is dependent on the process occurring within chamber 101. By way of example, process monitor 108 is an Optical Emission Spectrometer (OES). The OES monitors emission of radiation from plasma 130. Such radiation is dependent on the progress of the process occurring in process chamber 101. Alternatively, process monitor 108 could include an interferometer for measuring elevations such as the depth of trenches etched into a surface of the wafer 110. Such an interferometer measures the depth of the trenches by interference of light reflected from the top and bottom of the trenches. If process monitor 108 is an OES or interferometer, radiation from within chamber 101 is coupled to the process monitor through a transparent aperture such as quartz top 103. Alternatively a separate window can be provided in top 103 or sidewall 111 for this purpose.

Process monitor 108 and various components of system 100 are coupled to controller 140. Controller 140 includes hardware to provide the necessary signals to initiate, monitor, regulate, and terminate the processes occurring in process chamber 101. Process chamber 101 is, for example, a decoupled plasma source (DPS) etch chamber manufactured by Applied Materials of Santa Clara, Calif. Chamber 101 contains the elements necessary to process a semiconductor wafer.

The exterior of chamber 101 is typically at ambient atmospheric pressure and the interior of chamber 101 is held at a reduced pressure during processing. An exhaust system 109 regulates the pressure within chamber 101. A gas panel 120 delivers process gases to chamber 101 via a gas line 122 and a valve 124. In a process, such as an etch process, plasma 130 is formed in the chamber 101 by applying RF power to the process gas. RF power source 105 energizes antenna 102 to ignite and sustain the plasma within chamber 101. Those skilled in the art will realize that a plurality of steps are necessary to excite a plasma in a process chamber, i.e., supply a process gas, apply source power to the antenna, apply bias power to the pedestal and so on. These steps are within the skill of an ordinary practitioner in the art to perform without further explanation.

Figure 2B:
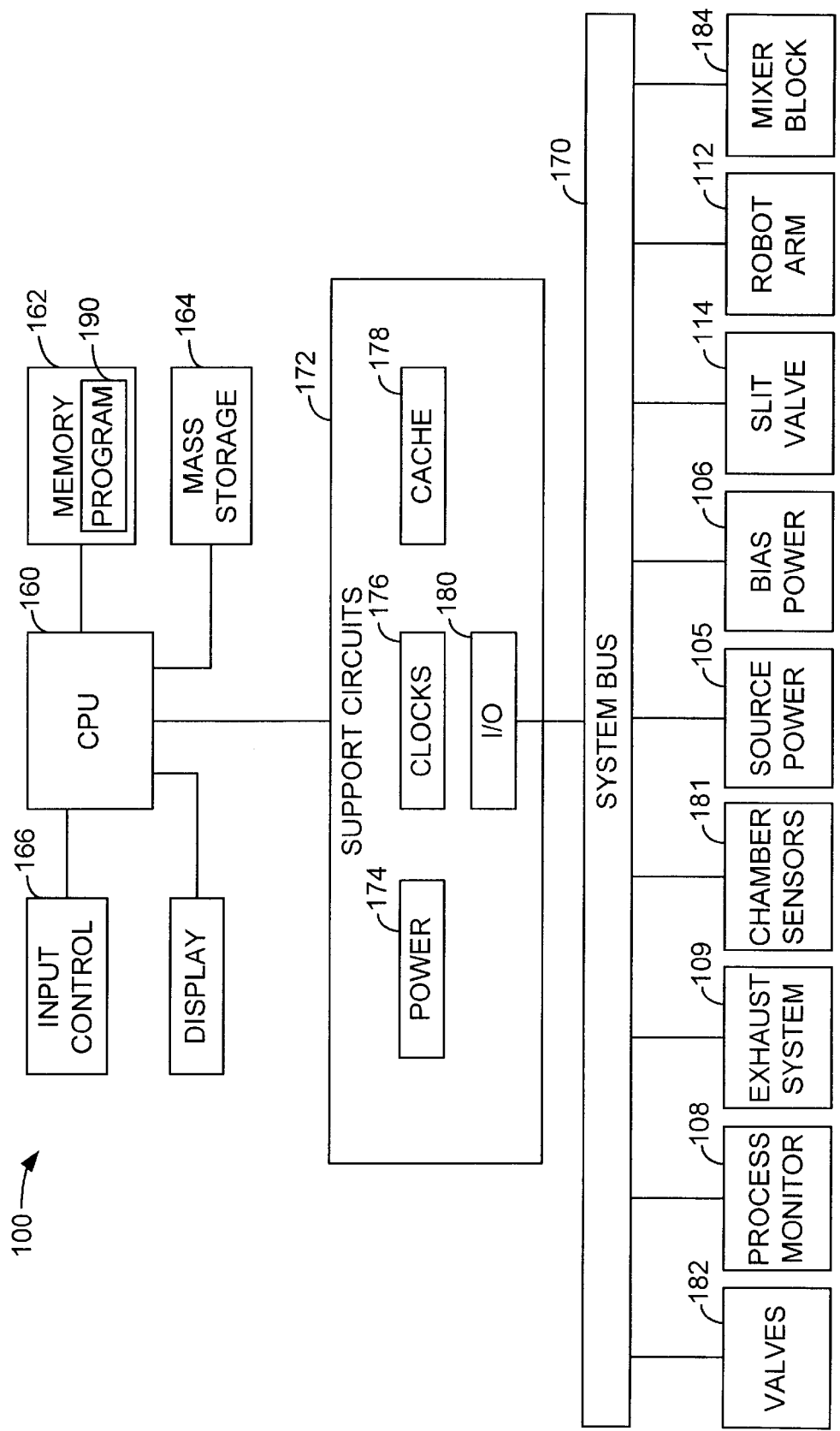
FIG. 2B shows a block diagram of the semiconductor wafer processing system of FIG. 2A.

The method of the present invention can be implemented in a system that is controlled by a processor based system controller such as controller 140 of FIG. 2A. FIG. 2B shows a block diagram of a processing system 100, such as that depicted in FIG. 2A, having such a system controller 140 that can be employed in such a capacity. System controller unit 140 includes a programmable central processing unit (CPU) 160 that is operable with a computer-readable memory 162, a mass storage device 164, an input control unit 166, and a display unit 168. The system controller further includes well-known support circuits 172 such as power supplies 174, clocks 176, cache 178, input/output (I/O) circuits 180 and the like. Controller 140 also includes hardware for monitoring wafer processing through sensors 181 in chamber 101. Such sensors measure system parameters such as wafer temperature, chamber atmosphere pressure and the like. All of the above elements are coupled to a control system bus 170.

Memory 162 contains instructions that CPU 160 executes to control the operation of processing system 158. The instructions in memory 162 are in the form of program code such as a program 190 that implements the method of the present invention. The program code may conform to any one of a number of different programming languages. For example, the program code can be written in C, C++, BASIC, Pascal, or a number of other languages. Computer program 190 may include a number of different subroutines. For example, in one specific embodiment, program 190 includes a process selective subroutine, a process sequencer subroutine and chamber manager subroutines for each chamber in a multichamber system. Program 190 also includes subroutines to control individual components of each chamber 101 including, for example, a substrate positioning subroutine, a process gas control subroutine, a pressure control subroutine, a temperature control subroutine and a plasma control subroutine among others. Those having ordinary skill in the art will readily recognize that other chamber control subroutines can be included depending on what processes are to be performed in process chamber 101.

Process selector subroutine identifies (i) the desired process chamber (if chamber 101 is part of a multichamber processing system) and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and can be entered utilizing input control interface 166.

The process sequencer subroutine includes program code for accepting the identified process chamber and set of process parameters from the process selector subroutine and for controlling operation of the various process chambers in a multichamber system. Multiple users can enter process set numbers and process chamber numbers, or a user can enter multiple process set numbers and process chamber numbers, so the sequencer subroutine operates to schedule the selected processes in the desired sequence. Preferably, the sequencer subroutine includes program code to (i) monitor the operation of the process chambers to determine if the chambers are being used, (ii) determine what processes are being carried out in the chambers being used, and (iii) execute the desired process based on availability of a process chamber and type of process to be carried out. Conventional methods of monitoring the process chambers can be used, such as polling. When scheduling which process is to be executed, the sequencer subroutine can take into consideration the present condition of the process chamber being used in comparison with the desired process conditions for a selected process, or the "age" of each particular user entered request, or any other relevant factor a system programmer desires to include for determining scheduling priorities.

Once the sequencer subroutine determines which process chamber and process set combination is going to be executed next, the sequencer subroutine initiates execution of the process set by passing the particular process set parameters to a particular chamber manager subroutine that controls multiple processing tasks in the particular process chamber according to the process set determined by the sequencer subroutine. In operation, the chamber manager subroutine selectively schedules or calls the process component subroutines in accordance with the particular process set being executed. Typically, the chamber manager subroutine monitors the various chamber components, determines which components need to be operated based on the process parameters for the process set to be executed, and causes execution of individual chamber component subroutines responsive to the monitoring and determining steps.

A person of ordinary skill in the art would understand how to implement each of the particular chamber component subroutines. For example, the substrate positioning subroutine would include program code for controlling chamber components that are used to load the substrate onto pedestal 107 and, optionally, to lift the pedestal and substrate to a desired height in chamber 101 for substrate processing.

Mass storage device 164 stores data and instructions and retrieves data and program code instructions from a processor readable storage medium, such as a magnetic disk or magnetic tape. For example, the mass storage device 164 can be a hard disk drive, floppy disk drive, tape drive, or optical disk drive. Mass storage device 164 stores and retrieves the instructions in response to directions that it receives from the CPU 160. Data and program code instructions that are stored and retrieved by mass storage device 164 are employed by processor unit 160 for operating the processing system 100. The data and program code instructions are first retrieved by the mass storage device 164 from a medium and then transferred to memory 162 for use by CPU 160.

Input control unit 166 couples a data input device, such as a keyboard, mouse, or light pen, to processor unit 160 to provide for the receipt of a chamber operator's inputs. Display unit 168 provides information to a chamber operator in the form of graphical displays and alphanumeric characters under control of CPU 160.

Control system bus 170 provides for the transfer of data and control signals between all of the devices that are coupled to the control system bus 170. Although the control system bus is displayed as a single bus that directly connects the devices in CPU 160, control system bus 170 can also be a collection of busses. For example, display unit 168, input control unit 166 and mass storage device 164 can be coupled to an input-output peripheral bus, while CPU 160 and memory 162 are coupled to a local processor bus. The local processor bus and input-output peripheral bus are coupled together to form control system bus 170.

System controller 140 is coupled to the elements of the processing system 100, employed in etch processes in accordance with the present invention via system bus 170 and I/O circuits 180. These elements include a plurality of valves 182 (such as valve 124 of FIG. 2A), process monitor 108, exhaust system 109, source power supply 105, bias power supply 106, slit valve 114, gas panel 120, robot arm 112, chamber sensors 181 and an optional mixer block 184 (not shown in FIG. 2A, but may be connected to either the gas panel 120 or chamber 101).

System controller 140 provides signals to the various chamber elements that cause these elements to perform desired operations in order to implement a desired process in chamber 101.

Although the invention is described herein as being implemented in software and executed upon a general purpose computer, those of skill in the art will realize that the invention could be implemented using hardware such as an application specific integrated circuit (ASIC) or other hardware circuitry. As such, it should be understood that the invention can be implemented, in whole or in part, in software, hardware or both. Those skilled in the art will also realize that it would be a matter of routine skill to select an appropriate computer system to control substrate processing system 100.

III. Etching Polysilicon According to the Present Invention

The method of the present invention can be used to etch polysilicon trenches in appropriate substrate processing chambers such as the exemplary chamber described above. The present invention forms a plasma from an etchant gas of $SF_6$, oxygen and nitrogen to etch the polysilicon trenches. The present inventors discovered, quite unexpectedly, that the $SF_6$/nitrogen/oxygen plasma etching chemistry can be optimized to provide greatly increased polysilicon etch rates as compared to other known $SF_6$ or HBr plasma etch chemistries. This, in turn, results in improved throughput and lower per wafer costs than other $SF_6$ or HBr chemistries.

Figure 3:
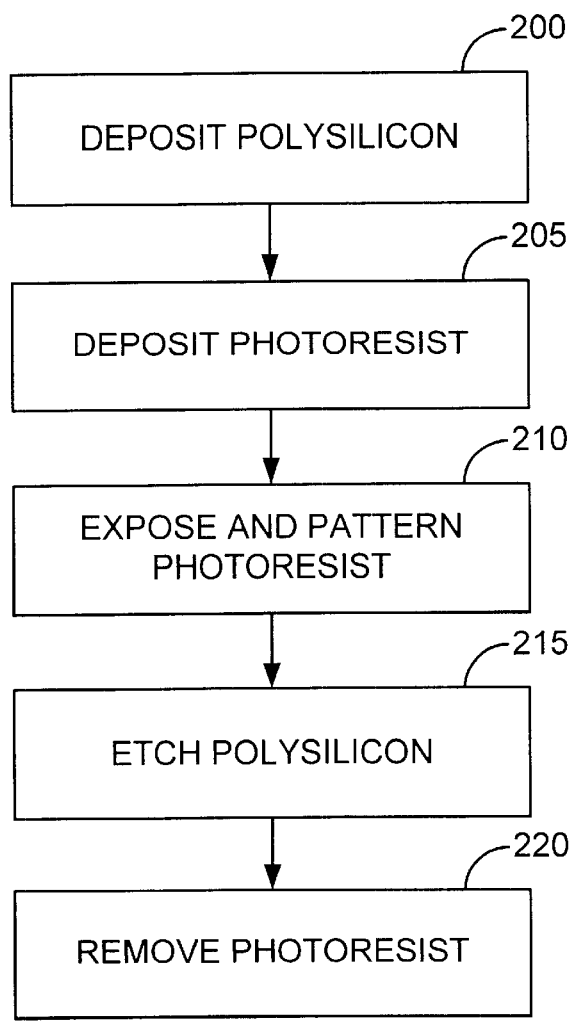
FIG. 3 is a flowchart illustrating the steps of a preferred embodiment of the present invention.

FIG. 3 illustrates a preferred process of the invention that is used to form deep trenches in a polysilicon layer deposited over a semiconductor substrate. The process is for exemplary purposes only and is not intended to limit the scope of the claims presented herein. Where applicable, reference numbers in the description below are used to refer to appropriate components of the exemplary chamber shown in FIGS. 2A–2B.

Figure 1:
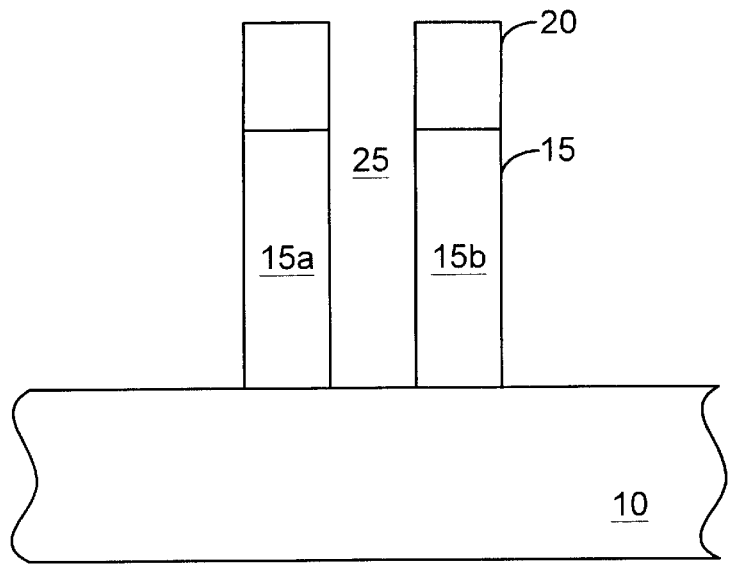
FIG. 1 is a simplified cross sectional view of a portion of a dynamic random access memory (DRAM) that includes a capacitor structure having vertical electrode plates.

In FIG. 3 a polysilicon layer, such as layer 15 shown in FIG. 1, is deposited over a semiconductor substrate that includes one or more integrated circuits at an unfinished processing stage (step 200). The polysilicon layer may be one of several different polysilicon layers deposited over the substrate. For example, a first polysilicon layer may be deposited to form a contact to transistors formed in the substrate and a second polysilicon layer may be deposited as polysilicon layer 15 to form part of the storage capacitors for DRAM memory cells.

Next, a photoresist layer is deposited over the polysilicon layer to be etched (step 205) using any of several well known photoresist deposition processes. The photoresist layer is then exposed to patterned light and selectively etched to form a photoresist mask that defines the locations at which the polysilicon layer will be etched (step 210). An example of such a patterned photoresist mask is shown in FIG. 1 as mask 20. The exposure and patterning techniques of step 210 are also well known to those of skill in the art.

Once the photoresist mask is formed, the substrate is transferred into a substrate etching chamber such as exemplary chamber 101 described above and exposed to an etchant plasma to etch the polysilicon (step 215). After the polysilicon layer is etched, the remaining photoresist mask is removed (step 220) and the substrate is ready for further processing (not shown) in order to complete the formation of integrated circuits formed thereon.

Of particular interest for the present application is the polysilicon etch process of step 215. A person of ordinary skill in the art will recognize that the other steps shown in FIG. 2, including steps 200, 205, 210 and 220 are standard process steps that define the location of the trenches to be etched in the polysilicon layer and then remove the photoresist layer after the polysilicon etch process is completed.

In a preferred embodiment, the process shown in step 215 of FIG. 3 is implemented and controlled using a computer program stored in a computer readable medium of memory 162 of substrate processing system 100. This embodiment flows an etchant gas that includes sulfur hexafluoride ($SF_6$), molecular oxygen ($O_2$) and molecular nitrogen ($N_2$) into chamber 101 and forms a plasma from the etchant gas to etch the polysilicon layer. The replacement of the fluorocarbon gas with $N_2$ results in an etch process that is able to etch a polysilicon stack having a vertical or slightly tapered profile without carbon contamination problem because the process does not use carbon based chemistry such as $CF_4$ and/or $CHF_3$. Additionally, the present inventors have found that the inclusion of $N_2$ in place of the fluorocarbon allows for an increased amount of $SF_6$ to be added to the etching process while still retaining control of the process to anisotropically etch the polysilicon layer and create the vertical or slightly tapered trench profile. The volume of $SF_6$ employed in preferred embodiments of the present invention is up to 2–3 times the amount typically used in an $SF_6$, HBr, $Cl_2$, process. The extra amount of $SF_6$, in turn, allows the present invention to achieve greatly increased etch rates as compared to the previously known $SF_6$, HBr, $Cl_2$, process.

The present inventors have determined that the ratios of $O_2$ to $SF_6$ and $SF_6$ to $N_2$ are important in achieving a process that satisfactorily meets requirements such as etch selectivity, etch rate and etch profile imposed by many DRAM manufacturers. More specifically, the present inventors have determined that the etchant gas should include a volume ratio of $SF_6$ to $N_2$ of between 1:1 and 4:1 and a volume ratio of $O_2$ to $SF_6$ of between 0.5:1 and 1:1.

The inventors discovered that the oxygen content of the etchant gas has a direct effect on the etch selectivity of the process. Too much oxygen eliminates the photoresist etch selectivity. Too little oxygen, on the other hand, impairs the sidewall passivation process and results in profile control problems. Thus, the present inventors have determined that the volume ratio of oxygen to $SF_6$ should be no more than 1:1 and should be at least 0.5:1. More preferred embodiments of the present invention use an oxygen to $SF_6$ ratio of between 0.8:1 and 1:1 inclusive.

The present inventors also determined that adding $N_2$ to the etchant gas helps achieve profile control. It is believed that nitrogen from the $N_2$ reacts with the photoresist/polysilicon stack to form an $(NH_4)_2SiF_6$ sidewall passivation film. Thus, varying the amount of $N_2$ in the etchant gas varies the vertical profile of the resulting structure. Using more $N_2$ results in a tapered profile (the bottom of trench being more narrow than the top of the trench) while using less $N_2$ results in a more vertical profile. If too little $N_2$ is added to the process, insufficient sidewall passivation will result and the etch will become isotropic rather than anisotropic. The ability to accurately control the profile of the etched trench is important as some applications require a slightly wider contact region at the bottom of the polysilicon film to ensure good silicon contact and reduce potential photolithography errors. Currently preferred embodiments of the present invention employ an $SF_6$ to $N_2$ ratio of between 1.5:1 and 2:1 inclusive.

Currently preferred embodiments of the present invention use an etchant gas having a flow of between about 40–60 sccm of $SF_6$, a flow of between about 10–30 sccm $N_2$ and a flow of between 30–60 sccm $O_2$. These embodiments employ a deposition pressure that is generally higher than typical $SF_6$, fluorocarbon, oxygen etch processes thereby further enhancing the etch rate. Currently preferred embodiments of the present invention set pressure within chamber 101 to between 30–100 mTorr and more preferably between 40–70 mTorr. Pressures in the upper ranges generally produce more radicals and result in a faster etch rate. At pressure levels above the preferred ranges it can become difficult to accurately control the etch profile which in turn may result in critical dimension control problems.

Currently preferred embodiments also employ a source RF power of between about 1000–2000 Watts and a bias RF power of between about 50–400 Watts. Even more preferred embodiments employ a source RF power of between 1200–1600 Watts, inclusive. Generally, higher source RF power levels create a more intense plasma that includes more radicals than a plasma formed from lower source RF power levels. The etch rate of the polysilicon etch process is also directly related to bias RF power. Generally, higher bias RF power levels generally result in increased etch rates. Bias power levels above 400 Watts can result in poor etch selectivity and an uncontrollable etch process.

One currently preferred embodiment of the present invention forms an etch plasma at 60 mTorr from an etchant gas including flows of 55 sccm $SF_6$, 30 sccm $N_2$ and 45 sccm $O_2$. Source RF power is set to 1500 Watts and bias RF power is set to 200 Watts. The dome 103 of chamber 101 is set at a temperature of 80° C., the pedestal is set to 20° C. and the walls are set to 65° C. Test results have determined that this embodiment provides a polysilicon etch rate greater than 15,000 Å/min and a photoresist etch selectivity of 3.6:1 while etching a 10,000 Å vertical trench.

In another embodiment the nitrogen and oxygen components of the etchant gas are provided by a combination of nitrous oxide ($N_2O$) and molecular oxygen. Thus, in these embodiments the etchant gas includes sulfur hexafluoride, nitrous oxide and molecular oxygen. The volume ratio of $SF_6$ to nitrous oxide is between 1:1 and 4:1 inclusive. The amount of oxygen required in this embodiment is less than that of the molecular nitrogen embodiment because some oxygen is provided by the $N_2O$ component of the etchant gas. The volume ratio of $O_2$ to $SF_6$ is between 0.25:1 and 0.5:1 inclusive. In an even more preferred version of this embodiment, the volume ratio of $SF_6$ to $N_2O$ is between 1.5:1 and 2:1 inclusive and the ratio of $O_2$ to $SF_6$ is between 0.4:1 and 0.5:1 inclusive.

The gas flow rates and RF power levels described above are based on etch processes run in a DPS chamber manufactured by Applied Materials that is outfitted for 200 mm wafers. A person of ordinary skill in the art will recognize that these values are in part chamber specific and may vary if chambers of other design and/or volume are employed.

Having fully described several embodiments of the present invention, many other equivalent or alternative embodiments of the present invention will be apparent to those skilled in the art. For example, the present invention can be used to form storage node structures different from the one shown in FIG. 1 and can be used to etch and form polysilicon structures other than DRAM storage nodes. The invention can also be used to etch trenches in a silicon substrate or in a silicon layer formed over a substrate. Also, helium, argon or another inert gas could be added to the etchant gas if desired to change the volume of gas flowed into the chamber. These equivalents and alternatives are intended to be included within the scope of the present invention.

What is claimed is:

1. A method of etching silicon on a substrate, said method comprising:
    forming a patterned photoresist layer directly on said silicon; and
    etching exposed areas of said silicon by:
        (i) flowing an etchant gas consisting of $SF_6$, molecular oxygen and molecular nitrogen into a substrate processing chamber wherein a volume ratio of said molecular oxygen to said $SF_6$ is between 0.5:1 and 1:1 inclusive and a volume ratio or said $SF_6$ to said molecular nitrogen is between 1:1 and 4:1 inclusive; and
        (ii) igniting a plasma within said chamber from said etchant gas.

2. A method of etching silicon on a substrate, said method comprising:
    forming a patterned photoresist layer directly on said silicon; and
    etching exposed areas of said silicon by:
        (i) flowing an etchant gas consisting of $SF_6$, molecular oxygen and nitrous oxide into a substrate processing chamber, wherein a volume ratio of said molecular oxygen to said $SF_6$ is between 0.25:1 and 0.5:1 inclusive and a volume ratio of said $SF_6$ to said nitrous oxide is between 1:1 and 4:1 inclusive; and
        (ii) igniting a plasma within said chamber from said etchant gas.

3. A method of etching silicon on a substrate disposed within a substrate processing chamber, said method comprising:
    flowing an etchant gas comprising $SF_6$, molecular oxygen and molecular nitrogen into said chamber, wherein a volume ratio of said molecular oxygen to said $SF_6$ is between 0.5:1 and 1:1 inclusive and a volume ratio of said $SF_6$ to said molecular nitrogen is between 1:1 and 4:1 inclusive;
    igniting a plasma within said chamber from said etchant gas; and
    etching said silicon.

4. The method of claim 3 wherein said volume ratio of said molecular oxygen to said $SF_6$ is between 0.8:1 and 1:1 inclusive.

5. The method of claim 3 wherein said volume ratio of said $SF_6$ to said molecular nitrogen is between 1.5:1 and 2:1 inclusive.

6. The method of claim 3 wherein said etchant gas consists of $SF_6$, molecular oxygen and molecular nitrogen.

7. The method of claim 3 wherein said silicon is polysilicon layer formed on said substrate.

8. The method of claim 3 wherein said silicon etched is a silicon substrate.

9. A method of forming a storage capacitor on a substrate, said method comprising:
    (a) depositing a polysilicon layer over the substrate;
    (b) forming a patterned photoresist mask on the polysilicon layer; and thereafter (
    c) etching said polysilicon layer by:
        (i) flowing an etchant gas comprising $SF_6$, molecular oxygen and molecular nitrogen into a substrate processing chamber, wherein a volume ratio of said molecular oxygen to said $SF_6$ is between 0.5:1 and 1:1 inclusive and a volume ratio of said $SF_6$ to said molecular nitrogen is between 1:1 and 4:1 inclusive; and
        (ii) applying inductively-coupled energy to said chamber to ignite a plasma within said chamber from said etchant gas; wherein an etch selectivity of silicon-to-photoresist is greater than 3.0:1 and an etch rate of silicon is at least 10,000 Å/min.

10. The method of claim 9 wherein said volume ratio of said molecular oxygen to said $SF_6$ is between 0.8 1 and 1:1 inclusive.

11. The method of claim 9 wherein said volume ratio of said $SF_6$ to said molecular nitrogen is between 1.5:1 and 2:1 inclusive.

12. The method of claim 9 wherein said etchant gas consists of $SF_6$, molecular oxygen and molecular nitrogen.

13. A method of etching silicon on a substrate disposed within a substrate processing chamber, said method comprising:

flowing an etchant gas comprising $SF_6$, nitrous oxide and molecular oxygen source into said chamber, wherein a volume ratio of said molecular oxygen to said $SF_6$ is between 0.25:1 and 0.5:1 inclusive and a volume ratio of said $SF_6$ to said nitrous oxide is between 1:1 and 4:1 inclusive;

igniting a plasma within said chamber from said etchant gas; and etching said silicon.

14. The method of claim 13 wherein said volume ratio of said molecular oxygen to said $SF_6$ is between 0.4:1 and 0.5:1 inclusive.

15. The method of claim 13 wherein said volume ratio of said $SF_6$ to said nitrous oxide is between 1.5:1 and 2:1 inclusive.

16. The method of claim 13 wherein said etchant gas consists of $SF_6$, nitrous oxide and molecular oxygen.

17. The method of claim 13 wherein said silicon is polysilicon layer formed on said substrate.

18. The method o claim 1 wherein said etch step exhibits silicon-to-photoresist etch selectivity of greater than 3.0:1.

19. The method of claim 18 wherein said etch step exhibits a silicon etch rate of at least 10,000 Å/min.

20. The method of claim 3 wherein said silicon that is etched is exposed to said plasma through plasma openings of a patterned photoresist layer.

21. The method of claim 13 wherein said silicon that is etched is exposed to said plasma through plasma openings of a patterned photoresist layer.

* * * * *